US008614489B2

(12) United States Patent
Campi et al.

(10) Patent No.: US 8,614,489 B2
(45) Date of Patent: *Dec. 24, 2013

(54) VERTICAL NPNP STRUCTURE IN A TRIPLE WELL CMOS PROCESS

(75) Inventors: John B. Campi, Westford, VT (US); Shunhua Thomas Chang, South Burlington, VT (US); Kiran V. Chatty, Williston, VT (US); Robert J. Gauthier, Jr., Hinesburg, VT (US); Junjun Li, Williston, VT (US); Rahul Mishra, Essex Junction, VT (US); Mujahid Muhammad, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/614,072

(22) Filed: Sep. 13, 2012

(65) Prior Publication Data

US 2013/0009207 A1    Jan. 10, 2013

Related U.S. Application Data

(63) Continuation of application No. 12/954,155, filed on Nov. 24, 2010, now Pat. No. 8,299,533.

(51) Int. Cl.
*H01L 29/76*    (2006.01)
(52) U.S. Cl.
USPC .................................. 257/378; 257/E27.031

(58) Field of Classification Search
USPC ......... 257/173, 174, 366, 377, 378, 511, 525, 257/E27.031
See application file for complete search history.

(56) References Cited

U.S. PATENT DOCUMENTS

| 4,631,567 | A | 12/1986 | Kokado et al. |
| 5,949,094 | A * | 9/1999 | Amerasekera ................. 257/173 |
| 6,770,918 | B2 | 8/2004 | Russ et al. |
| 7,023,029 | B1 | 4/2006 | Vashchenko et al. |
| 7,456,477 | B2 | 11/2008 | Amerasekera et al. |
| 7,755,161 | B2 | 7/2010 | Liu et al. |
| 7,834,400 | B2 | 11/2010 | Huang |
| 8,299,533 | B2 * | 10/2012 | Campi et al. ................... 257/355 |
| 2007/0023866 | A1 | 2/2007 | Chatty et al. |
| 2008/0308837 | A1 | 12/2008 | Gauthier, Jr. et al. |

OTHER PUBLICATIONS

USPTO, Notice of Allowance issued in related U.S. Appl. No. 12/954,155 dated Jul. 20, 2012.

* cited by examiner

*Primary Examiner* — Quoc Hoang
(74) *Attorney, Agent, or Firm* — Wood, Herron & Evans LLP; Anthony J. Canale

(57) ABSTRACT

A vertical NPNP structure fabricated using a triple well CMOS process, as well as methods of making the vertical NPNP structure, methods of providing electrostatic discharge (ESD) protection, and design structures for a BiCMOS integrated circuit. The vertical NPNP structure may be used to provide on-chip protection to an input/output (I/O) pad from negative-voltage ESD events. A vertical PNPN structure may be also used to protect the same I/O pad from positive-voltage ESD events.

19 Claims, 3 Drawing Sheets

VERTICAL NPNP STRUCTURE IN A TRIPLE WELL CMOS PROCESS

CROSS-REFERENCE TO RELATED APPLICATIONS

This application is a continuation of application Ser. No. 12/954,155, filed Nov. 24, 2010 (pending), which is hereby incorporated by reference herein in its entirety.

BACKGROUND

The present invention relates generally to semiconductor device fabrication and, more particularly, to electrostatic discharge (ESD) devices for protecting an Input/Output pad in radio frequency and analog mixed signal applications, as well as methods of forming ESD protection devices and design structures for BiCMOS integrated circuits.

Modern electronics achieve high levels of functionality in small form factors by integrating multiple functions onto a single chip. A common fabrication process that allows high levels of integration at a relatively low cost is Complementary Metal-Oxide-Semiconductor (CMOS). CMOS processes build a combination of p-type and n-type metal-oxide-semiconductor field-effect transistors (MOSFETs) to implement logic gates and other types of digital circuits. By introducing additional fabrication steps into a CMOS process forming MOSFETs, bipolar junction transistors can also be formed in a process commonly known as BiCMOS. BiCMOS processes are often used to fabricate single-chip mixed signal integrated circuits when the performance requirements of the analog section cannot be met by MOSFETs alone.

Chips are often exposed to electrostatic discharge (ESD) events leading to potentially large and damaging currents within the integrated circuit. Increasing integration densities and performance demands on CMOS and BiCMOS chips have resulted in reduced device dimensions, which have increased the susceptibility of the integrated circuit to ESD. Manufacturers, assemblers, and users of integrated circuits must take precautions to avoid ESD. For example, ESD prevention can be part of the integrated circuit itself and may include special design techniques for input and output pins.

The problem of providing effective ESD protection in mixed signal applications is further complicated by the necessity of handling analog signals. Analog signals typically present a wider range of voltages than digital signals, thus requiring mixed signal chips to tolerate larger input voltages before ESD protection devices are triggered. This reduces the voltage window for ESD device operation, placing a further constraint on the types of devices that can be used. High frequency applications further require that ESD protection devices provide low capacitive loading of the input.

Therefore, there is a need for improved ESD protection devices that can protect an integrated circuit from negative and/or positive electrostatic discharges, as well as methods of making ESD protection devices and design structures for BiCMOS integrated circuits.

BRIEF SUMMARY

In one embodiment, a device structure includes first and second regions of n-type semiconductor material, first and second regions of p-type semiconductor material, and an input/output (I/O) pad electrically connected to the first region of n-type semiconductor material and the first region of p-type semiconductor material. The first region of p-type semiconductor material is stacked vertically between the first and second regions of n-type semiconductor material to form a vertical NPN bipolar transistor. The first and second regions of p-type semiconductor material are stacked vertically relative to the second region of n-type semiconductor material to form a vertical PNP bipolar transistor. The first region of p-type semiconductor material is shared between the first vertical NPN bipolar transistor and the first vertical PNP bipolar transistor. The second region of n-type semiconductor material is shared between the first vertical NPN bipolar transistor and the first vertical PNP bipolar transistor. The second region of n-type semiconductor material and the second region of p-type semiconductor material are configured to be electrically connected to a positive power supply voltage such that an electrostatic discharge (ESD) pulse of negative voltage at the I/O pad is directed through the first vertical NPN bipolar transistor and the first vertical PNP bipolar transistor to a power supply supplying the positive power supply voltage In another embodiment, the device structure is an ESD protection device structure that is included in a design structure, which is embodied in a machine readable storage medium for designing, manufacturing, or testing an integrated circuit. The design structure may comprise a netlist. The design structure may also reside on storage medium as a data format used for the exchange of layout data of integrated circuits. The design structure may reside in a programmable gate array.

In another embodiment, a method is provided for fabricating a device structure includes forming a vertical stack in a p-type substrate containing first and second n-type semiconductor regions and a first p-type semiconductor region that are arranged in depth to define a first vertical NPN bipolar transistor and a first vertical PNP bipolar transistor. The p-type semiconductor region is shared between the first vertical NPN bipolar transistor and the first vertical PNP bipolar transistor. The second n-type semiconductor region is shared between the first vertical NPN bipolar transistor and the first vertical PNP bipolar transistor. A first wiring path, which is formed in an interconnect structure, is connected to the first n-type semiconductor region and the p-type semiconductor region. The method further includes forming an I/O pad connected by the first wiring path to the first n-type semiconductor region and the p-type semiconductor region of the first vertical NPN bipolar transistor. A second wiring path, which is formed in the interconnect structure, is configured to connect the second n-type semiconductor region and the p-type semiconductor region of the first vertical PNP bipolar transistor to a positive power supply voltage.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

A triple well process is typically implemented in CMOS and BiCMOS processes to improve isolation between devices. In a typical single well process implemented on a p-type substrate, islands of n-type silicon (n-wells) may be established within a p-type substrate as a step in forming CMOS devices. Additional wells may then be formed within the n-wells by introducing p-type dopants in a concentration effective to form p-wells when activated. A triple well process may establish additional n-doped wells within a p-well to form a series of alternately doped semiconductor islands, which allows later formed islands to be enclosed by earlier formed islands. Devices may thereby be isolated from each other by the depletion regions that form near the boundaries between n-type and p-type semiconductors. In particular, the depletion layer between the p-type substrate and the first n-well may provide isolation between the substrate and devices formed in the n-well. Similar structures may also be implemented by starting with an n-type substrate and substituting a p-well for the first n-well. In an embodiment of the invention, the previously described p-n junction formed between the n-well and the p-type substrate may be employed to form part of a vertical NPNP structure forming an SCR useful in protecting against ESD. The vertical NPNP structure is able to tolerate normal input voltages over a wide range without reducing its effectiveness against ESD.

Figure 1:
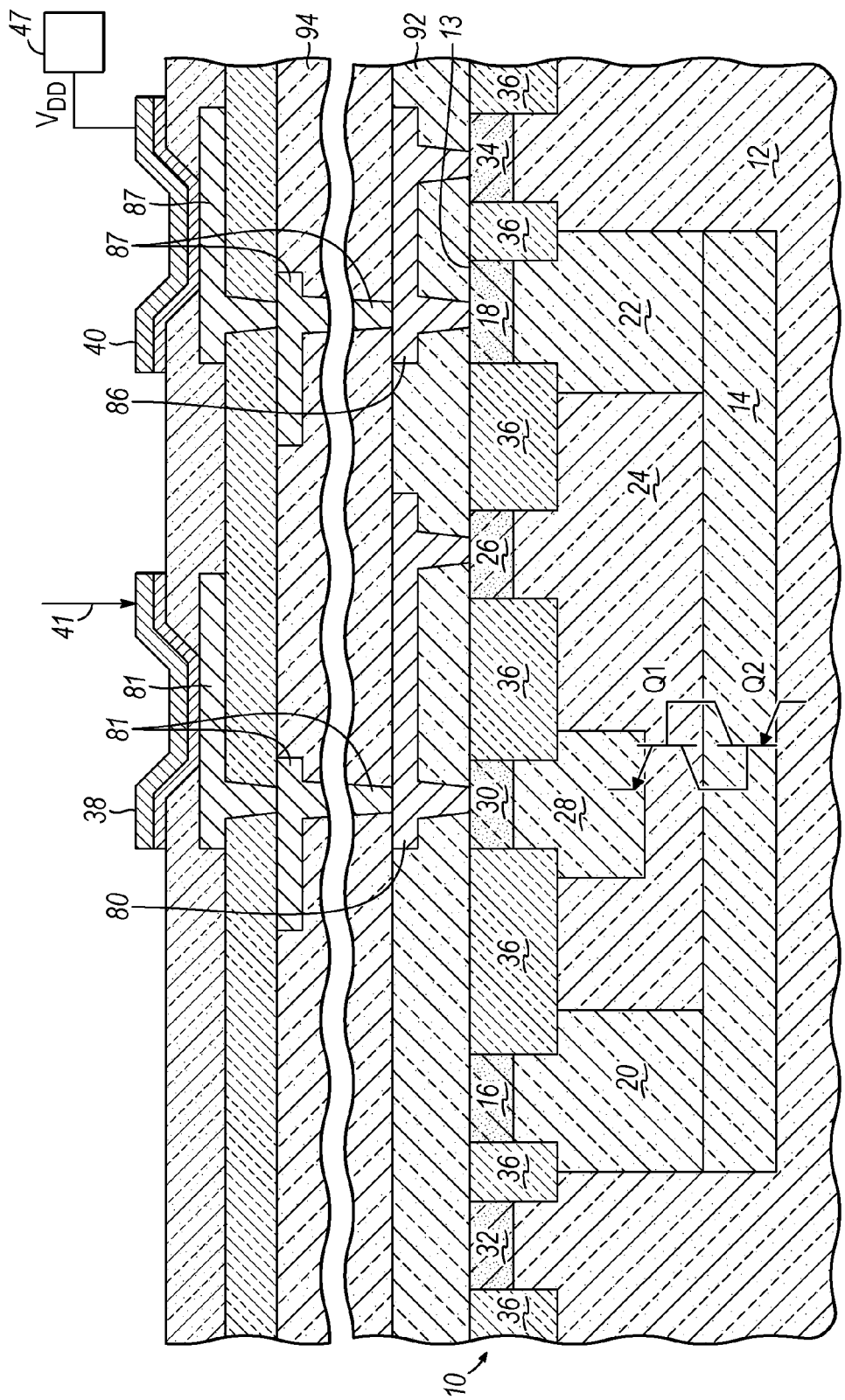
FIG. 1 is a diagrammatic cross-sectional view of a vertical NPNP device structure in accordance with an embodiment of the invention.

With reference to FIG. 1 and in accordance with an embodiment of the invention, a semiconductor device 10 used for negative-voltage ESD protection includes a buried or deep n-well 14, contact regions 16, 18, and n-wells 20, 22 formed in an active region of a bulk substrate 12. The contact regions 16, 18, which intersect a top surface 13 of the substrate 12, are electrically coupled to the deep n-well 14 by the n-wells 20, 22. The deep n-well 14, contact regions 16, 18, and n-wells 20, 22 have a conductivity type opposite to the conductivity type of the substrate 12 and typically contain different dopant concentrations such that the regions have comparatively different electrical conductivities. The substrate 12 may be comprised of lightly-doped p-type semiconductor material, such as p$^-$ silicon, and is preferably monocrystalline or single-crystal material.

The deep n-well 14 may be a region of substrate 12 doped with an n-type dopant at a concentration sufficient to form lightly-doped n-type semiconductor material, such as n$^-$ silicon. The n-type contact regions 16, 18 may be regions of substrate 12 doped with an n-type dopant at concentration sufficient to form heavily-doped semiconductor material, such as n$^+$ silicon, with a reduced electrical resistance in comparison with the respective n-wells 20, 22. The n-wells 20, 22 may be regions of substrate 12 doped with an n-type dopant at a concentration sufficient to form lightly-doped n-type semiconductor material, such as n silicon. The n-wells 20, 22 and contact regions 16, 18 define a conductive reach-through region extending from the top surface 13 of the substrate 12 to the deep n-well 14.

Semiconductor device 10 further includes a p-well 24 and an isolated n-well 28 within the p-well 24. The p-well 24 is comprised of p-type semiconductor material characterized by a conductivity type opposite to the conductivity type of the deep n-well 14, n-wells 20, 22, and contact regions 16, 18. The n-wells 20, 22 define a ring surrounding the p-well 24 for lateral isolation and the deep n-well 14 underlies the p-well 24 such that the p-well 24 is isolated from the substrate 12. The p-well 24 may be a region of substrate 12 lightly doped with a p-type dopant at a concentration sufficient to form lightly-doped p-type semiconductor material, such as p$^-$ silicon. The p-well 24 is electrically coupled to a p-type contact region 26, which may be a region of substrate 12 intersecting the top surface 13 and doped with a p-type dopant at a concentration sufficient to form heavily-doped p-type semiconductor material, such as p$^+$ silicon, with a reduced electrical resistance in comparison with the p-well 24.

The isolated n-well 28 is enclosed within the p-well 24, which isolates the n-well 28 from the neighboring n-wells 20, 22 and deep n-well 14, and is therefore formed at a shallower depth than the deep n-well 14. The isolated n-well 28 is a region of substrate 12 doped with an n-type dopant at a concentration sufficient to form lightly-doped n-type semiconductor material, such as n silicon. The isolated n-well 28 is electrically coupled with an n-type contact region 30, which is a region of substrate 12 intersecting the top surface 13 and doped with an n-type dopant at a concentration sufficient to form heavily-doped n-type semiconductor material, such as n silicon, characterized by a reduced electrical resistance in comparison with the isolated n-well 28. Additional contact regions 32, 34 formed of heavily-doped semiconductor material, such as p$^+$-doped silicon, may be electrically coupled to the substrate 12.

Dielectric regions 36 are defined in the substrate 10 and are configured to laterally isolate the various contact regions 16, 18, 26, 30, 32, 34. The dielectric regions 36 may be formed by a shallow trench isolation (STI) technique that relies on a lithography and dry etching process to define closed-bottomed trenches in substrate 12, fills the trenches with dielectric material, and planarizes the layer to the top surface 13 of the substrate 12 using a chemical mechanical polishing (CMP) process. The dielectric material may be an oxide, such as densified tetraethylorthosilicate (TEOS) deposited by thermal chemical vapor deposition (THCVD) or a high-density plasma (HDP) oxide deposited with plasma assistance.

The isolated n-well 28, p-well 24, deep n-well 14, and substrate 12 define a vertical NPNP structure consisting of a vertical NPN bipolar transistor Q1 and a vertical PNP bipolar transistor Q2. The vertical NPNP structure has a vertical arrangement along an axis normal to the top surface 13 of the substrate 12. A first p-n junction is formed along an interface between the isolated n-well 28 and p-well 24. A second p-n junction is formed along an interface between the p-well 24 and deep n-well 14. A third p-n junction is formed along an interface between the deep n-well 14 and substrate 12.

The vertical NPN bipolar transistor Q1 may be formed from the top three regions of the NPNP structure, with transistor Q1 having an emitter region or cathode defined by isolated n-well 28, a gate or base region defined by p-well 24, and a collector region or anode defined by deep n-well 14. The vertical PNP bipolar transistor Q2 may be formed having an emitter region or cathode defined by the semiconductor substrate 12, a gate or base region defined by deep n-well 14, and a collector or anode defined by p-well 24. Transistors Q1 and Q2 of semiconductor device 10 may thereby collectively share the p-well 24 and deep n-well 14 and form a vertical Silicon Controlled Rectifier (SCR) device.

An input/output (I/O) pad 38 may be electrically coupled to contact regions 26, 30 so that the base and cathode of the vertical NPN bipolar transistor Q1 are connected in series and shorted. Contact regions 18, 34 may be electrically coupled to a power pad 40 so that the base and anode of the vertical PNP bipolar transistor Q2 are connected in series and shorted. The power pad 40 is electrically connected to a terminal of a power supply 47 that supplies a substantially constant voltage source such as, for example, a supply voltage $V_{DD}$, or a reference voltage source that is different than $V_{DD}$ such as, for example, a voltage that is greater than $V_{DD}$.

In this manner, an ESD path for a negative-voltage ESD pulse 41 is defined through the transistors Q1, Q2 from the I/O pad 38 to the pad 40 connected with the supply voltage $V_{DD}$ of the power supply 47. Due to its vertical configuration, transistor Q2 may have a shorter base length than a horizontally configured PNP transistor as known in the art. The breakdown voltage may be selected by adjusting the doping levels of p-well 24 and deep n-well 14.

The SCR defined by the semiconductor device 10 provides ESD protection for negative-voltage ESD pulses at the I/O pad 38. The SCR remains in a high impedance state until a negative voltage from the ESD pulse 41 across it exceeds a threshold voltage, at which point the SCR switches to a low impedance state. Once triggered, the SCR remains in the low impedance state until the current of the negative voltage ESD pulse 41 flowing through it drops below a threshold—known as the holding current—thereby remaining on until the ESD pulse 41 has dissipated.

Figure 2:
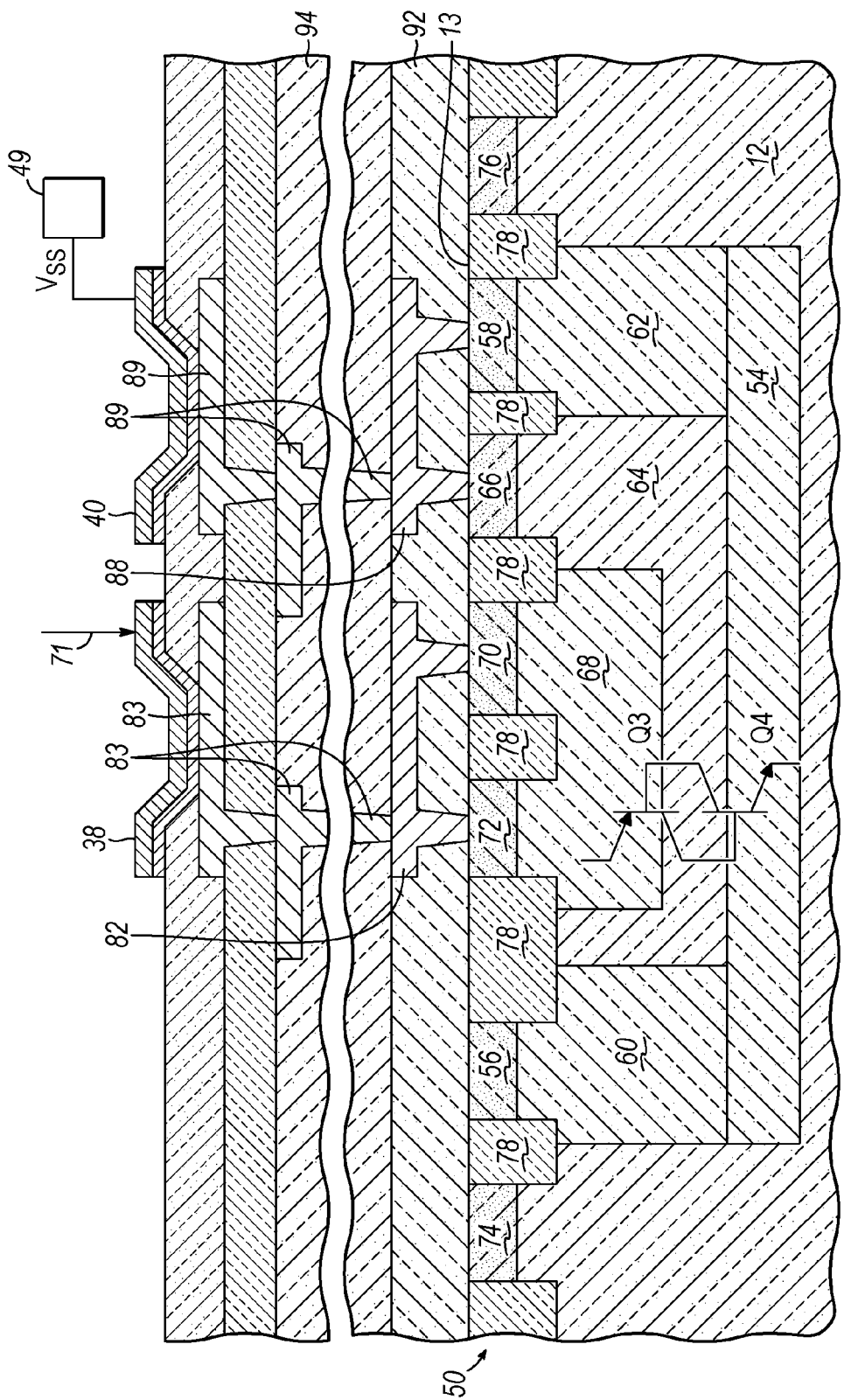
FIG. 2 is a diagrammatic cross-sectional view of a vertical PNPN device structure built on a different another portion of the substrate used to build the vertical NPNP device structure of FIG. 1.

With reference to FIG. 2 in which like reference numerals refer to like features in FIG. 1 and in accordance with another embodiment of the invention, a semiconductor device 50 used for positive-voltage ESD protection includes, a buried deep n-well 54, n-type contact regions 56, 58, and n-wells 60, 62 formed in a different active region of the substrate 12 than device 10 (FIG. 1). The contact regions 56, 58 are electrically coupled to the deep n-well 54 by the n-wells 60, 62. The contact regions 56, 58 and n-wells 60, 62 define a conductive reachthrough region extending from the top surface 13 of the substrate 12 to the deep n-well 54. The deep n-well 54, contact regions 56, 18, and n-wells 60, 62 have a conductivity type opposite to the conductivity type of the substrate 12 and typically contain different dopant concentrations such that the regions have different electrical conductivities.

The deep n-well 54 is a region of substrate 12 doped with an n-type dopant at a concentration sufficient to form lightly-doped n-type semiconductor material, such as n⁻ silicon. The contact regions 56, 58 are comprised of regions of substrate 12 that intersect the top surface 13 and are doped with an n-type dopant at a concentration sufficient to form heavily-doped n-type semiconductor material, such as n⁺ silicon. The n-wells 60, 62 are regions of substrate 12 doped with an n-type dopant at a concentration sufficient to form lightly-doped n-type semiconductor material, such as n⁻ silicon. The n-wells 60, 62 physically comprise a continuous ring-shaped region of lightly-doped semiconductor material and intersect the top surface 13 of the substrate 12.

Semiconductor device 50 further includes a p-well 64 and an isolated n-well 68 within the p-well 64. The p-well 64 is comprised of p-type semiconductor material characterized by a conductivity type opposite to the conductivity type of the deep n-well 54, n-wells 60, 62, and contact regions 56, 58. The N-wells 60, 62 define a ring surrounding the p-well 64 for lateral isolation and the deep n-well 54 underlies the p-well 64 such that the p-well 64 is isolated from the substrate 12. The contact regions 56, 58 likewise physically comprise a continuous ring-shaped region of heavily-doped semiconductor material. The p-well 64 is a region of substrate 12 doped with a p-type dopant at a concentration sufficient to form lightly-doped p-type semiconductor material, such as p⁻ silicon. The p-well 64 is electrically coupled to a p-type contact region 66, which is a region of substrate 12 intersecting the top surface 13 of the substrate 12 and doped with a p-type dopant at a concentration sufficient to form heavily-doped n-type semiconductor material, such as p⁺ silicon.

The isolated n-well 68 is enclosed within the p-well 64 so that the n-well 68 is electrically isolated from the other n-wells 60, 62 and deep n-well 54. The isolated n-well 68 is a region of substrate 12 doped with an n-type dopant at a concentration sufficient to form lightly-doped n-type semiconductor material, such as n silicon. The isolated n-well 68 is electrically coupled with an n-type contact region 70. Contact region 70 is region of substrate 12 electrically coupled with isolated n-well 68 and doped with an n-type dopant at a concentration sufficient to form heavily-doped n-type semiconductor material, such as n⁺ silicon. A p-type contact region 72 is also formed in the isolated n-well 68 region of substrate 12 and is doped with a p-type dopant at a concentration sufficient to form heavily-doped p-type semiconductor material, such as p⁺ silicon. Additional contact regions 74, 76 formed of heavily-doped semiconductor material, such as p⁺-doped silicon, may be electrically coupled to the substrate 12. The contact regions 70, 72, 74, 76 each intersect the top surface 13 of the substrate 12. Dielectric regions 78, which are structurally similar to dielectric regions 26 and formed in a similar manner, laterally isolate contact regions 56, 58, 66, 70, 72, 74, 76.

The contact 72, isolated n-well 68, p-well 64, and deep n-well 54 define a vertical PNPN structure consisting of a vertical PNP bipolar transistor Q3 and a vertical PNP bipolar transistor Q4. The vertical PNPN structure has a vertical arrangement along an axis normal to the top surface 13 of the substrate 12. A first p-n junction is formed along an interface between the contact 72 and isolated n-well 68. A second p-n junction is formed along an interface between the isolated n-well 68 and p-well 64. A third p-n junction is formed along an interface between the p-well 64 and deep n-well 54.

The vertical PNP bipolar transistor Q3 may be formed from the top three regions of the PNPN structure, with transistor Q3 having an emitter region or cathode defined by contact region 72, a base region defined by isolated n-well 68, and a collector region or anode defined by p-well 64. The vertical NPN bipolar transistor Q4 may be formed having an emitter region or cathode defined by the deep n-well 54, a base region defined by p-well 64, and a collector or anode defined by isolated n-well 68. Transistors Q3 and Q4 of semiconductor device 50 may thereby collectively share the isolated n-well 68 and p-well 64 and form a vertical SCR device.

The I/O pad 38 is electrically coupled to contact regions 70, 72 so that the base and anode of the vertical PNP bipolar transistor Q3 are connected in series and shorted. Contact regions 58, 66 are electrically coupled to the power pad 40 so that the base and cathode of the vertical NPN bipolar transistor Q4 are connected in series and shorted. In this manner, an ESD path for a positive-voltage ESD 71 is defined through the transistors Q3, Q4 from the I/O pad 38 to the power pad 40 coupled with the terminal on a power supply 49 that supplies the negative supply voltage $V_{SS}$.

The PNPN SCR defined by the semiconductor device 50 provides ESD protection for positive voltage ESD pulses at the I/O pad 38. The SCR remains in a high impedance state until a positive voltage from the ESD pulse 71 across it exceeds a threshold voltage, at which point the SCR switches to a low impedance state. Once triggered, the SCR remains in the low impedance state until the current of the positive-voltage ESD pulse 71 flowing through it drops below the holding current, thereby remaining on until the ESD pulse 71 has dissipated.

The device structures of FIGS. 1 and 2 may be formed utilizing standard CMOS or BiCMOS fabrication process steps applied during the fabrication of transistor structures on the substrate 12. As understood by a person having ordinary skill in the art of semiconductor fabrication, these standard CMOS or BiCMOS fabrication process steps may dope different regions of substrate 12 by masking, implanting dopants of suitable impurity species with suitable kinetic energies, and thermally activating the implanted dopants. Formation of the regions of the devices 10, 50 may be performed simultaneously with formation of the wells and contacts used in the fabrication of CMOS PFETs and/or NFETs used in the functional circuits of an integrated circuit on substrate 12 to be protected by the SCR ESD protection devices whose fabrication is being described. In particular, formation of the wells of the devices 10, 50 may proceed concurrently with the formation of n-wells and p-wells of triple-well structures in other regions of the substrate 12 that are used to fabricate CMOS PFETs and/or NFETs.

In one fabrication sequence, the dielectric regions 36 for device 10 and the dielectric regions 78 for device 50 are formed by standard CMOS or BiCMOS process steps in the substrate. The dielectric regions 36, 78 may be formed by a conventional STI process and may be formed concurrently with similar dielectric regions (not shown) for other device structures on the substrate 12.

The deep n-well 14 of device 10 and the deep n-well 54 of device 50 are concurrently created in the p-type silicon substrate 12 by applying a patterned mask layer on the substrate 12 and implanting ions of Phosphorous (P), Arsenic (As), Antimony (Sb), or other suitable n-type dopant at one or more selected kinetic energies into the semiconductor material of the substrate 12. Windows in the patterned mask layer expose the substrate 12 at the intended locations for the deep n-wells 14, 54. During each ion implantation, the patterned mask layer blocks the ions of n-type dopant from penetrating into the substrate 12 outside of the windows. Each implantation includes an ion dose selected to yield a desired dopant concentration. Similar windows may be provided in the patterned mask layer for implanting deep n-wells of triple well structures in other regions of the substrate 12 that are used to fabricate CMOS PFETs and/or NFETs.

The n-wells 20, 22 of device 10 and the n-wells 60, 62 of device 50 may be concurrently created in the p-type silicon substrate 12 by applying a patterned mask layer on the substrate 12 and implanting ions of an n-type dopant at one or more selected kinetic energies into the semiconductor material of the substrate 12. Windows in the patterned mask layer expose the substrate 12 at the intended locations for the n-wells 20, 22, 60, 62. During each ion implantation, the patterned mask layer blocks the ions of n-type dopant from penetrating into the substrate 12 outside of the windows. Each implantation includes an ion dose selected to yield a desired dopant concentration. Similar windows may be provided in the patterned mask layer for implanting reach-through n-wells of triple well structures in other regions of the substrate 12 that are used to fabricate CMOS PFETs and/or NFETs.

The p-well 24 of device 10 and the p-well 64 of device 50 may be concurrently created in the p-type silicon substrate 12 by applying a patterned mask layer on the substrate 12 and implanting ions of Boron (B), Aluminum (Al), Gallium (Ga), or any other suitable p-type dopant at one or more selected kinetic energies into the semiconductor material of the substrate 12. Windows in the patterned mask layer expose the substrate 12 at the intended locations for the p-wells 24, 64. During each ion implantation, the patterned mask layer blocks ions from penetrating into the substrate 12 outside of the windows. Each implantation includes an ion dose selected to yield a desired dopant concentration. Similar windows may be provided in the patterned mask layer for implanting p-wells of triple well structures in other regions of the substrate 12 that are used to fabricate CMOS PFETs and/or NFETs.

The isolated n-well 28 of device 10 and the isolated n-well 68 of device 50 may be concurrently created in the p-type silicon substrate 12 by applying a patterned mask layer on the substrate 12 and implanting ions of an n-type dopant at one or more selected kinetic energies into the semiconductor material of the substrate 12. Windows in the patterned mask layer expose the substrate 12 at the intended locations for the isolated n-well 28, 68. During each ion implantation, the patterned mask layer blocks the ions of n-type dopant from penetrating into the substrate 12 outside of the windows. Similar windows may be provided in the patterned mask layer for implanting isolated n-wells of triple well structures in other regions of the substrate 12 that are used to fabricate CMOS PFETs and/or NFETs.

The n-type contact regions 16, 18, 30 of device 10 and the n-type contact regions 56, 58, 70 of device 50 may be concurrently created in the p-type silicon substrate 12 by applying a patterned mask layer on the substrate 12 and implanting ions of an n-type dopant at one or more selected kinetic energies into the semiconductor material of the substrate 12. Windows in the patterned mask layer expose the substrate 12 at the intended locations for the n-type contact regions 16, 18, 30, 56, 58, 70. During each ion implantation, the patterned mask layer blocks the ions of n-type dopant from penetrating into the substrate 12 outside of the windows. Similar windows may be provided in the patterned mask layer for implanting n-type contact regions of triple well structures in other regions of the substrate 12 that are used to fabricate CMOS PFETs and/or NFETs.

The p-type contact region 26 of device 10 and the p-type contact regions 66, 72 of device 50 may be concurrently created in the p-type silicon substrate 12 by applying a patterned mask layer on the substrate 12 and implanting ions of a p-type dopant at one or more selected kinetic energies into the semiconductor material of the substrate 12. Windows in the patterned mask layer expose the substrate 12 at the intended locations for the n-type contact regions 26, 66, 72. During each ion implantation, the patterned mask layer blocks the ions of n-type dopant from penetrating into the substrate 12 outside of the windows. Similar windows may be provided in the patterned mask layer for implanting p-type contact regions of triple well structures in other regions of the substrate 12 that are used to fabricate CMOS PFETs and/or NFETs.

In each instance, the ion implantation mask may be a photoresist layer comprised of a sacrificial organic material and applied to the surface 13 of substrate 12 by spin coating. The photolithography process entails exposing the photoresist layer to radiation imaged through a photomask and developing the resultant latent feature pattern in the exposed resist to define windows that expose portions of the substrate 12 at the intended locations for the implanted wells or contacts. After each implantation, the mask is stripped from the surface 13.

Standard back-end-of-line (BEOL) processing follows the formation of devices 10, 50 to form a BEOL interconnect structure. Each level of the BEOL interconnect structure may be fabricated by damascene processes, such as a dual damascene process in which a dielectric layer is deposited, vias and trenches are etched in the dielectric layer, and the vias and trenches are filled with a conductor using a single blanket deposition followed by planarization. The damascene process is replicated to stack multiple wiring levels so that a multi-level, high density framework of conductive interconnections is formed. Damascene processes and materials used in damascene processes are understood by a person having ordinary skill in the art.

The BEOL interconnect structure includes one or more lower dielectric layers 92 containing metallization 80, 82, 86, 88 that supplies local interconnect wiring, and one or more upper dielectric layers 94 containing metallization 81, 83, 87, 89 for levels of interconnect wiring. The metallization 80, 81 defines a wiring path coupling the I/O pad 38 with the local interconnect wiring of contacts 26, 30. The metallization 82, 83 defines a wiring path coupling the I/O pad 38 with the local interconnect wiring of contacts 70, 72. The metallization 86, 87 defines a wiring path coupling the power pad 40 with the local interconnect wiring for contact regions 18, 34. The metallization 88, 89 defines a wiring path coupling the power pad 40 with the local interconnect wiring for contact regions 58, 66.

The I/O pad 38 and power pad 40 are fabricated using BEOL processes, such as layer deposition, photolithography and subtractive etching understood by a person having ordinary skill in the art. For example, the I/O pad 38 and power pad 40 may be fabricated by depositing a layer stack including a top layer of aluminum (Al), copper (Cu), or an alloy (e.g., AlCu) onto the topmost level of the interconnect wiring and shaping the layer stack with one or more photolithography and etching processes.

Figure 3:
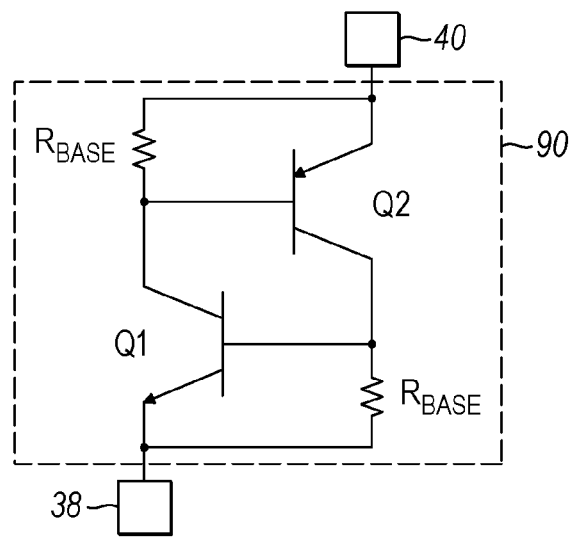
FIG. 3 is a diagrammatic schematic illustrating the electrical configuration of the vertical NPNP device structure in FIG. 1.

With reference to FIG. 3, which presents a schematic diagram of the SCR 90 formed by transistors Q1 and Q2 as shown in FIG. 1, the SCR 90 is shown connected in a breakdown configuration. In operation, the I/O pad 38 is electrically coupled to contact regions 26, 30, and contact regions 18, 34 are electrically coupled to the power pad 40 and the supply voltage $V_{DD}$, thereby forming an ESD path for a negative-voltage ESD pulse 41 from the I/O pad 38 to the power pad 40 through the SCR 90. During normal circuit operation conditions, the I/O pad 38 is biased at a voltage lower than $V_{DD}$, which results in the p-n junction of the SCR 90 between the n-well 22 and the p-well 24 being reversed biased and maintains the SCR 90 in a high-impedance state, sometimes referred to as a reverse blocking mode.

During an ESD event, the NPNP structure works to discharge negative current from the I/O pad 38 to the positive power supply voltage $V_{DD}$. When a negative-voltage ESD pulse 41 occurs, the voltage at I/O pad 38 may drop sufficiently below the substrate bias voltage at the power pad 40 to cause the reverse breakdown voltage of the p-n junction to be exceeded. The p-n junction may then break down, injecting a large number of carriers into the p-well 24 defining the base region of transistor Q1 and into the deep n-well 14 defining the base region of transistor Q2. The presence of these carriers may trigger transistors Q1 and Q2 to switch on, providing a low impedance path from the I/O pad 38 though the transistors Q1, Q2 to the power pad 40, which may shunt the high current in the ESD pulse 41 safely away from the I/O pad 38 and the integrated circuit on the substrate 12 to the supply voltage $V_{DD}$ of the power supply 47. Once the current path from the anode to the cathode of the SCR 90 is established, the transistors Q1, Q2—and thus the SCR 90—remain in a low-impedance state until the current from the ESD pulse 41 drops below the holding current. When the ESD pulse 41 has dissipated, the current through the SCR 90 drops below the holding current, and the SCR 90 reverts back to a high impedance state awaiting the occurrence of another ESD pulse 41.

The NPNP SCR structure supplied by device 10 is capable of providing ESD protection in RF and analog/mixed signal applications which have non-standard voltage requirements at the I/O pad 38. In these demanding applications, the voltage swing requirement at the I/O pad 38 may be ±10 volts during normal operation. The relatively large voltage on the I/O pad 38 during normal operation prevents the effective use of conventional ESD devices, such as grounded gate NFETs and diodes. In particular, the NPNP SCR structure supplied by device 10 may be used in applications that require a large negative voltage (e.g., a voltage of less than or equal to −5 volts) on the I/O pad 38 during normal operation.

Referring now to FIG. 2, positive voltage ESD protection may be provided by the vertical SCR formed by transistors Q3 and Q4 by electrically coupling I/O pad 38 to contact regions 70, 72, which may include the SCR device anode. Contact regions 58, 66, which may include the SCR device cathode, may be electrically coupled to the power pad 40, thereby forming an ESD path for a positive-voltage ESD pulse 71 from the I/O pad 38 to the power pad 40 and the negative power supply voltage $V_{SS}$ of the power supply 47 through the PNPN SCR device 50.

During normal circuit operation condition, because the voltage on the I/O pad 38 is always higher than $V_{SS}$, the p-n junction of the p-well 64 and n-well 68 is reverse biased, which may keep the SCR device in a high-impedance state. During an ESD event, the PNPN structure works to discharge positive current from the I/O pad 38 to the negative power supply voltage $V_{SS}$. When an ESD pulse 71 occurs that drives the I/O pad 38 voltage above the breakdown voltage of the reverse biased p-n junction, the p-n junction may break down, which in turn may inject a large number of carriers into the respective base regions of Q3 and Q4. The presence of these carriers may cause transistors Q3 and Q4 to switch into a low impedance state, thereby shunting the ESD current to the power pad 40. Once a current from the anode to the cathode of the SCR device is established, the transistors Q3, Q4—and thus the SCR structure—may remain in a low-impedance state until the current drops below the holding current. When the ESD pulse 71 has dissipated and the current through the SCR device drops below the holding current, the SCR device may revert back to a high impedance state and await the occurrence of another positive-voltage ESD pulse 71.

Thus, in an embodiment of the invention, both positive and negative ESD protection may be provided by electrically coupling I/O pad 38 with the contacts 26, 30, 70, 72 for both the NPNP and PNPN SCR structures as previously and separately described. However, in alternative embodiments, the NPNP and PNPN SCR structures may be electrically coupled with different I/O pads so that the NPNP structure protects the I/O pad 38 against negative voltage ESD pulses or events.

Figure 4:
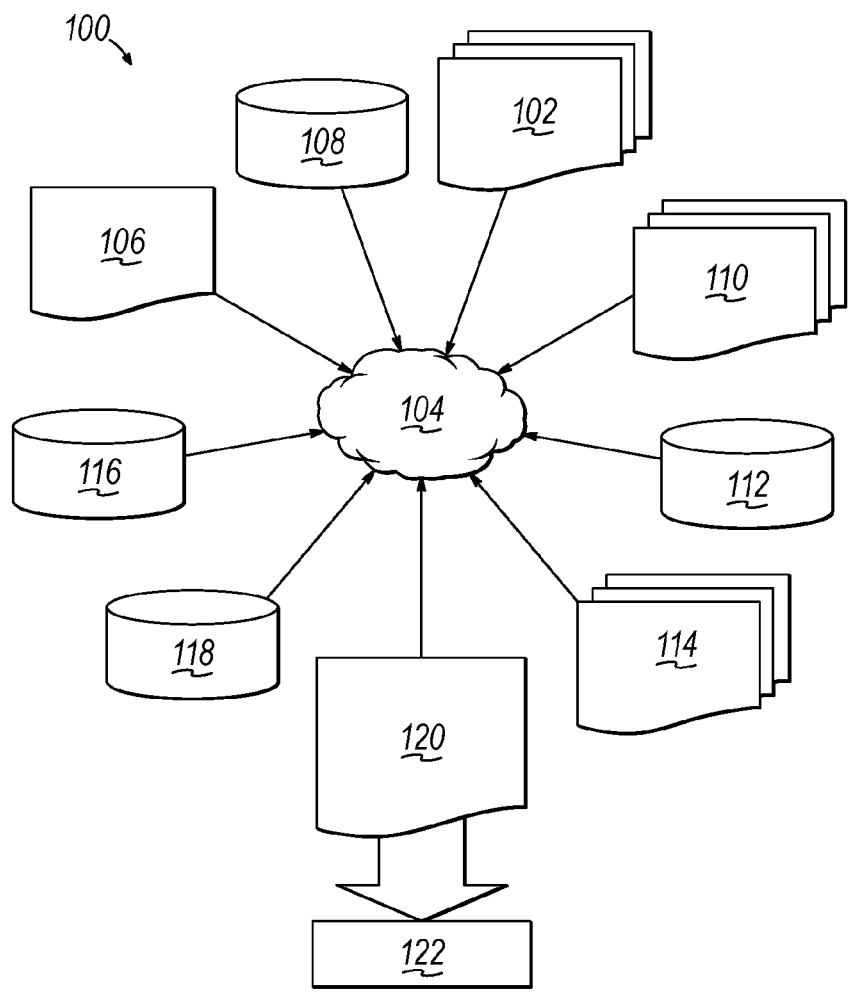
FIG. 4 is a flow diagram of a design process used in semiconductor design, manufacture, and/or test.

FIG. 4 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIG. 1. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIG. 1. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIG. 1 to generate a Netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including Netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 120 may comprise a compiled, executable HDL simulation model that functionally simulates the devices shown in FIG. 1.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A device structure comprising:
    a first region of n-type semiconductor material;
    a second region of n-type semiconductor material;
    a first region of p-type semiconductor material, the first region of p-type semiconductor material stacked vertically between the first and second regions of n-type semiconductor material to form a vertical NPN bipolar transistor;
    a second region of p-type semiconductor material, the first and second regions of p-type semiconductor material stacked vertically relative to the second region of n-type semiconductor material to form a vertical PNP bipolar transistor;
    an input/output (I/O) pad coupled with the first region of n-type semiconductor material and the first region of p-type semiconductor material; and
    an interconnect structure including a first wiring path coupling the first region of n-type semiconductor and the first region of p-type semiconductor material with the I/O pad.

2. The device structure of claim 1 wherein the vertical NPN bipolar transistor and the vertical PNP bipolar transistor comprise a vertical NPNP structure formed on a first portion of a substrate, and further comprising:
    a vertical PNPN structure electrically coupled with the I/O pad, the vertical PNPN structure located on a second portion of the substrate different from the first portion of the substrate.

3. The device structure of claim 1 wherein the second region of p-type semiconductor material is a bulk substrate, the first region of p-type semiconductor material, the first region of n-type semiconductor material, and the second region of n-type semiconductor material are wells of a triple well structure formed in the bulk substrate, and, and further comprising:
    a plurality of contact regions intersecting a top surface of the bulk substrate, each of the contact regions coupled with a respective one of the wells of the triple well structure.

4. The device structure of claim 3 further comprising:
    a plurality of dielectric regions intersecting the top surface of the bulk substrate, each of the dielectric regions positioned laterally between an adjacent pair of the contact regions.

5. The device structure of claim 3 wherein each contact region is comprised of semiconductor material having the same conductivity type as the respective well of the triple well structure to which the contact region is electrically coupled.

6. The device structure of claim 1 wherein the second region of p-type semiconductor material is a p-type bulk substrate, the second region of n-type semiconductor material is a first n-well in the p-type bulk substrate, the first region of p-type semiconductor material is a p-well in the p-type bulk substrate that surrounds the first n-well, and the second region of n-type semiconductor material is a second n-well in the p-type bulk substrate that surrounds the p-well.

7. The device structure of claim 6 wherein the p-type bulk substrate has a top surface, the first n-well extends laterally beneath the p-well, and further comprising:
    an n-type conductive reachthrough region extending from the top surface of the p-type bulk substrate to contact the first n-well.

8. The device structure of claim 1 wherein the first region of n-type semiconductor material is a cathode of the vertical NPN bipolar transistor, the second region of n-type semiconductor material is an anode of the vertical NPN bipolar transistor, the first region of p-type semiconductor material is a base of the vertical NPN bipolar transistor, and the base of the vertical NPN bipolar transistor is shorted to the cathode of the of the vertical NPN bipolar transistor.

9. The device structure of claim 8 wherein the second region of p-type semiconductor material is an anode of the vertical PNP bipolar transistor, the second region of n-type semiconductor material is a base of the vertical PNP bipolar transistor that is shared with the anode of the vertical NPN bipolar transistor, the second region of p-type semiconductor material is a cathode of the vertical PNP bipolar transistor that is shared with the base of the vertical NPN bipolar transistor, and the base of the vertical PNP bipolar transistor is shorted to the anode of the vertical PNP bipolar transistor.

10. The device structure of claim 1 wherein the vertical NPN bipolar transistor and the vertical PNP bipolar transistor are configured as a breakdown-triggered silicon-controlled rectifier (SCR).

11. The device structure of claim 1 wherein the first region of p-type semiconductor material is shared between the vertical NPN bipolar transistor and the vertical PNP bipolar transistor.

12. The device structure of claim 1 wherein the second region of n-type semiconductor material is shared between the vertical NPN bipolar transistor and the vertical PNP bipolar transistor.

13. The device structure of claim 1 wherein the second region of n-type semiconductor material and the second region of p-type semiconductor material are configured to be coupled to a positive power supply voltage such that an electrostatic discharge (ESD) pulse of negative voltage at the I/O pad is directed through the vertical NPN bipolar transistor and the vertical PNP bipolar transistor to a power supply supplying the positive power supply voltage.

14. The device structure of claim 1 wherein the interconnect structure includes a second wiring path coupling the second region of n-type semiconductor and the second region of p-type semiconductor with a positive power supply voltage.

15. The device structure of claim 1 wherein the I/O pad is configured to be coupled with a voltage of less than or equal to −5 volts during normal operation.

16. The device structure of claim 1 wherein the device structure is configured to support a voltage swing requirement at the I/O pad of ±10 volts during normal operation.

17. The device structure of claim 1 further comprising:
   a first junction defined between the first region of n-type semiconductor material and the first region of p-type semiconductor material;
   a second junction defined between the first region of p-type semiconductor material and the second region of n-type semiconductor material; and
   a third junction is defined between the second region of n-type semiconductor material and the second region of p-type semiconductor material.

18. The device structure of claim 1 wherein the first region of n-type semiconductor material, the second region of n-type semiconductor material, the first region of p-type semiconductor material, and the second region of p-type semiconductor material are formed in a substrate comprised of lightly-doped p-type semiconductor material, and further comprising:
   a ring-shaped n-well surrounding the first region of p-type semiconductor material, the ring-shaped n-well providing lateral electrical isolation of the first region of p-type semiconductor material from the substrate.

19. The device structure of claim 18 wherein the second region of n-type semiconductor material underlies the first region of p-type semiconductor material, the second region of n-type semiconductor material providing vertical electrical isolation of the first region of p-type semiconductor material from the substrate.

* * * * *